United States Patent [19]

Sibata et al.

[11] Patent Number: 4,952,555
[45] Date of Patent: Aug. 28, 1990

[54] SUPERCONDUCTING MATERIAL $BA_{1-x}(Y_{1-w}\gamma_w)CUO_z$ ($\gamma$ = TI, ZR, HF, SI, GE, SN, PB, OR MN) AND A PROCESS FOR PREPARING THE SAME

[75] Inventors: Kenichiro Sibata; Nobuyuki Sasaki; Shuji Yazu; Tetsuji Jodai, all of Hyogo, Japan

[73] Assignee: Sumimoto Electric Industries, Ltd., Osaka, Japan

[21] Appl. No.: 173,940

[22] Filed: Mar. 28, 1988

[30] Foreign Application Priority Data

Mar. 28, 1987 [JP] Japan .................................. 62-74967

[51] Int. Cl.$^5$ ...................... C01B 13/32; C01F 11/02; C01F 17/00; C01G 3/02
[52] U.S. Cl. ......................................... 505/1; 252/521; 423/604; 423/635; 501/123; 501/152; 505/780
[58] Field of Search ...................... 502/84; 505/1, 780; 252/521; 423/604, 635; 501/123, 152

[56] References Cited

PUBLICATIONS

Wu "Superconductivity at 93K in a New Mixed-Phase Y-Ba-Cu-O . . . ", *Phys. Rev. Lett.* vol. 58 No. 9 Mar. 2, 1987 pp. 908-910.

Bourne "Onset of Superconductivity in Y-Ba-Cu-O at 100K", *Physics Letters A* vol. 120 (9) Mar. 23, 1987 pp. 494-496.

*Primary Examiner*—Paul Lieberman
*Assistant Examiner*—John Boyd
*Attorney, Agent, or Firm*—Foley & Lardner, Schwartz, Jeffery, Schwaab, Mack, Blumenthal & Evans

[57] ABSTRACT

Superconducting material of oxide which have a composition represented by the general formula:

$$\{\alpha_{1-x}(\beta_{1-w}\gamma_w)_x\}\delta_y\epsilon_z$$

particularly, $\{Ba_{1-x}(Y_{1-w}\gamma_w)_x\}Cu_yO_z$ in which, "$\gamma$" represents at least one element selected from a group consisting of titanium (Ti), hafnium (Hf), silicon (Si), germanium (Ge), tin (Sn), lead (Pb) and manganese (Mn), and "X", "Y" "W" and "Z" represent numbers which are selected in the following ranges: $0.1 \leq X \leq 0.9$, $0.4 \leq y \leq 1.0$, $1 \leq z \leq 5$ and $0.01 \leq w \leq 0.50$ and which have crystal structures of perovskite type or quasiperovskite type.

15 Claims, No Drawings

SUPERCONDUCTING MATERIAL $BA_{1-x}(Y_{1-w}\gamma_w)CUO_z$ ($\gamma$=TI, ZR, HF, SI, GE, SN, PB, OR MN) AND A PROCESS FOR PREPARING THE SAME

BACKGROUND OF THE INVENTION

1. Field of the invention

The present invention relates to superconducting material and a process for preparing the same, more particularly, it relates to a superconducting material which exhibits a higher critical temperature of superconductivity and a reduced smaller discrepancy between the critical temperature and the onset temperature where phenomenon of superconductivity is started to be observed and a process for producing the same.

In this specification, "Tcf" stands for the critical temperature of superconductivity, "Tc" stands for the onset temperature where phenomenon of superconductivity is started to be observed and $\Delta T$ stands for discrepancy between Tc and Tcf.

2. Description of the related art

Under the superconducting condition, the perfect diamagnetism is observed and no difference in potential is observed for all that an electric current of a constant finite value is observed internally, and hence, a variety of applications of superconductivity have been proposed in a field of electric power transmission as a mean for delivering electric power without loss.

The superconductivity can be utilized in the field of power electric applications such as MHD power generation, power transmission, electric power reservation or the like; in the field of transportation for example magnetic levitation trains, or magnetically propelling ships; in the medical field such as high-energy beam radiation unit; in the field of science such as NMR or high-energy physics; a high sensitive sensors or detectors for sensing very weak magnetic field, microwave, radiant ray or the like, or in the field of fusion power generation.

In addition to the abovementioned power electric applications, the superconducting materials can be used in the field of electronics, for example, as a Josephson device which is an indispensable switching device for realizing a high-speed computer which consumes very reduced power.

However, their actual usage have been restricted because the phenomenon of superconductivity can be observed only at very low cryogenic temperatures. Among known superconducting materials, a group of materials having so-called A-15 structure show rather higher Tc (critical temperature of superconductivity) than others, but even the top record of Tc in the case of $Nb_3Ge$ which showed the highest Tc could not exceed 23.2K at most. This means that liquidized helium (boiling point of 4.2K) is only one cryogen which can realize such very low temperature of Tc. However, helium is not only a limited costly resource but also require a large-scaled system for liquefaction. Therefore, there had been a strong demand for another superconducting materials having higher Tc. But no material which exceeded the abovementioned Tc had been found for all studies for the past ten years.

Possibility of existence of a new type of superconducting materials having much higher Tc was revealed by Bednorz and Müller who discovered a new oxide type superconductor in 1986 [Z. Phys. B64 (1986)189]

This new oxide type superconducting material is [La, Ba]$_2$CuO$_4$ or [La, Sr]$_2$CuO$_4$ which are called as the $K_2NiF_4$-type oxide having a crystal structure which is similar to known perovskite type oxide. The $K_2NiF_4$-type oxides show such higher Tc as 30 to 50K which are extremely higher than the known superconducting materials and hence it becomes possible to use liquidized hydrogen (b.p.=20.4K) or liquidized neon (b.p.=27.3K) as a cryogen which bring them to exhibit the superconductivity.

It was also reported in the news parer that C. W. Chu et al discovered in the United States of America another type of superconducting material having the critical temperature of in the order of 90K in Feb. 1987, and hence possibility of existence of high-temperature superconductors have burst on the scene.

In case of the abovementioned superconducting materials of perovskite type oxides or quasi-perovskite types oxides, it is reported that the "Tc" is approaching to 70K. However, the discrepancy between Tc and Tcf of oxides which were reported up to today is very big. Namely, the value of $\Delta T$ often becomes more than 30K.

When the superconductivity is realized in liquidized nitrogen in practice, it is indispensable that the value of Tcf of the superconducting material is higher than 77K. Therefore, it is desired to develop improved superconducting material having higher Tc.

Therefore, an object of the present invention is to provide a new superconducting material which exhibit higher "Tc" and "Tcf" and a process for producing the same.

SUMMARY OF THE INVENTION

The present invention provides a superconducting material of oxide which have a composition represented by the general formula:

$$\{\alpha_{1-x}(\beta hd\ 1-w\gamma w)_x\}\delta_y\epsilon_z$$

in which,

"$\alpha$" represents one element selected from a group consisting of elements of IIa group of the Periodic Table, "$\beta$" represents one element selected from a group consisting of elements of IIIa group of the Periodic Table, "$\gamma$" represents at least one element selected from a group consisting of titanium (Ti), hafnium (Hf), silicon (Si), germanium (Ge), tin (Sn), lead (Pb) and manganese (Mn), "$\delta$" represents one element selected from a group consisting of elements of Ib group, IIb group, IIIb group and VIII group of the Periodic Table, "$\epsilon$" represents oxygen (O), and "x", "y", "w" and "z" represent numbers which are selected in the following ranges:

$0.1 \leq x \leq 0.9;\ 0.4 \leq y \leq 1.0$ $1 \leq z \leq 5;\ 0.01 \leq w \leq 0.50$ and which have crystal structures of perovskite type or quasi-perovskite type.

The present invention also provides a process for producing the abovementioned superconducting material which have crystal structures of perovskite type or quasi-perovskite type oxide having an average crystal grain of less than 30 $\mu$m, characterized by steps comprising mixing a powder of oxide or carbonate of said element "$\alpha$", a powder of oxide or carbonate of said "$\beta$", a powder of oxide or carbonate of said element "$\gamma$" and a powder of oxide or carbonate of said element "δ" in such proportions that the atom ratio of said elements "α":"β":"γ":"δ" is adjusted to $(1-x):(1-w)x:wx:y$, wherein, "x", "w" and "y" represent numbers which are selected in the following ranges:

$0.1 \leq x \leq 0.9$; $0.4 \leq y \leq 1.0$; $0.01 \leq w \leq 0.50$;

subjecting the mixture obtained to preliminary sintering, pulverizing a preliminary sintered mass, compacting the resulting pulverized powder into a shaped body, and subjecting the shaped body to the final sintering at a temperature which is not higher than a melting point of said pulverized powder but is not lower than 100° C. from the melting point.

The superconducting material according to the present invention is a sort of compound oxides of an element of group IIa, an element of group IIIa and one of elements of group Ib, IIb, IIIb and VIII of the Periodic Table, which have the crystal structure of perovskite type or quasi-perovskite type which have been already reported as a superconducting material having relatively higher critical temperatures.

The present inventors found after a series of experiments that another type superconducting materials having much higher Tc can be obtained when a portion of said element selected from a IIa group, for example Y, is replaced by at least one of tetravalent ions of elements of IVa group or IVb group, namely, $Ti^{4+}$, $Zr^{4+}$, $Si^{4+}$, $Ge^{4+}$, $Sn^{4+}$, $Pb^{4+}$ and $Mn^{4+}$. It is supposed that electrons which are expelled into a crystal by the displacement of trivalent ion by tetravalent ion contribute to the higher Tc.

The amount of substitution by the elements of IVa group or IVb group or the atom ration of "w" is selected in a range of from 0.01 to 0.50. If the value is short of the abovementioned lower limit, substantial improvement in Tc can not be observed, and also if the value exceeds the abovementioned upper limit, the resulting Tc will drop or become worse.

The superconducting material according to the present invention is produced in a form of a sintered body by sintering a powders of oxides or carbonates of constituent elements of the superconducting material.

Oxygen contents in the final sintered body is adjusted by controlling sintering conditions and by selecting the starting material which contain preferably at least one of oxides of the constituent elements. According to a preferred embodiment, adjustment or control of oxygen contents in the sintered product of oxide is preferably effected by carrying out the operation of the preliminary sintering and/or the final sintering in an oxygen containing atmosphere.

It is preferable that the shaped body possesses a relative density of from 60 to 80%. In fact when the relative density exceeds the upper limit of 80%, the shaped body is compacted excessively so that it is difficult or impossible to perform the abovementioned control by the surrounding atmosphere. To the contrary, if the relative density is not higher than the lower limit of 60%, the resulting product of sintered body will not show satisfactory mechanical strength and hence become fragile.

It is also preferable that the final sintering is carried out at a temperature selected in a range the upper limit which is a melting point of said preliminary sintered mass. Preferably, this temperature is not lower than 100° C. from the melting point. Namely, when the sintering temperature is not higher than the lower limit, sintering reaction can not proceed satisfactorily and the sintered product obtained shows very low mechanical strength. To the contrary, if the sintering temperature exceeds the upper limit, liquid phase is produced during the sintering operation, so that the sintered mass is fused or decomposed resulting in lowering the Tc of the sintered body.

The preliminary sintering is carried out at a temperature ranging from 700° C. to 1,000° C. When the temperature of the preliminary sintering is not higher than 700° C., satisfactory solid reaction do not proceed so that the desired crystal structure can not be obtained, while, if the preliminary sintering is carried out at a temperature which exceed 1,000° C., the resulting preliminary sintered mass contain solid solution phase or larger crystal grains which make it difficult to obtain finer particles in following pulverization step.

It is important to reduce the size of crystal grains as small as possible so that the finally sintered body possesses increased area of crystal boundaries. Therefore, according to preferred embodiment, the starting material powders are sintered preliminarily and then pulverized into a finer powder before the final sintering is effected. The sequence of preliminary sintering, pulverization and compacting to the shaped body is preferably repeated for several times.

In fact, according to the present invention, each of the starting material powders preferably have an average particle size of less than 20 μm and the powder obtained by the preliminary sintering step have preferably an average particle size of less than 10 μm. When the particle size to be sintered preliminarily or finally become larger, the final product of sintered body contain larger crystal grains. However, pulverization of unduly longer time can neither yield better result nor is a waste of time. Therefore, the abovementioned ranges of average particle sizes are satisfactory to obtain the objective sintered body having an average crystal grain size of 30 μm.

The superconducting material obtained according to the abovementioned conditions possess a very fine crystal structure which contribute to higher critical temperature.

It is also supposed that the superconductors of the perovskite type oxide or quasi-perovskite type oxide exhibit its improved property particularly in the neighborhood of its surface portion, since a reaction between the superconductor and the surrounding atmosphere during the sintering step or the heat-treatment step may proceed favorably in the neighborhood of the surface portion. Accordingly, it is also preferable that the shaped body to be sintered has a thinner or finer dimension in order to convert the material powder into a superconductor effectively.

According to another preferred embodiment, the sintered body obtained is further heat-treated in order to produce substantially uniform perovskite type oxide or quasi-perovskite type oxide. This heat-treatment is very effective to improve the critical temperature from which electrical resistance become zero. The heat-treatment is preferably carried out at a temperature ranging from 500° C. to 800° C.

In fact, if the temperature of the heat-treatment is not higher than 500° C., a significant improvement can not be observed. To the contrary, when the heat-treatment is carried out at a temperature which exceeds 800° C., the critical temperature drop remarkably. In other words, when the heat-treatment is carried out at a temperature which is outside the range of from 500° C. to 800° C., proper oxygen deficiency can not be obtained, and it exerts an adverse influence on Tc of the resulting sintered body. Experiments of the present inventors reveal that this heat-treatment is very effective to improve the onset temperature Tcf.

According to another preferred embodiment, it is also preferable to quench the sintered shaped body obtained after the final sintering rapidly, directly after the final sintering or after the sintered shaped body is reheated at a temperature ranging from 500° to 800° C. in order to improve the critical temperature.

Finally, it is also possible to use the abovementioned superconducting material according to the present invention as a target for physical vapour deposition such as sputtering technique in order to produce a superconducting thin film having a higher Tc which is applicable to Josephson device, SQUID (Superconducting Quantum Interference Device), a variety of sensors or the like.

Now, embodiments of the process according to the present invention will be described with reference to illustrative Examples, but the scope of the present invention should not be limited thereto.

EXAMPLES

At first, powders of $BaCO_3$, $Y_2O_3$, CuO and oxides of elements "$\gamma$" namely, titanium (Ti), hafnium (Hf), silicon (Si), germanium (Ge), tin (Sn), lead (Pb) and manganese (Mn) are prepared. Each powder has a purity of more than 2N and an average particle size of less than 1.5 μm.

The powders are mixed together in such proportions that the values of relative atom ratio of "x":"y":"w" becomes equal to the values shown in Table 1, wherein, the "x", "y" and "w" represent atom ratios in the formula:

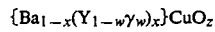

to prepare a variety of samples of powder mixtures each having the atom ratio of Ba:Y:$\gamma$:Cu=(1−x):(1−w)x:wx:y which is shown in Table 1.

The powder mixture samples are sintered preliminarily at 920° C. for 12 hours in oxygen stream to obtain a cake-like solid mass of preliminary sintered body. Then, the solid mass is pulverized in a molter. The same procedure as the abovementioned combination of preliminary sintering and pulverization is repeated for three times. The powder obtained by the final pulverization is further subjected to another pulverization in a high-purity zirconia ball mill for 8 hours to obtain a finer preliminary sintered powder having an average particle size of less than 6 μm.

The preliminary sintered powder thus obtained is press molded in a mold having a dimensions of 4×2×20 mm under a pressure of 0.8 ton/cm² and then sintered finally at 940° C. for 5 in a high-pressure furnace containing oxygen gas of 3 atm.

To determine the critical temperature (Tcf) and the onset temperature (Tc) of the thus obtained sintered bodies, electrodes are connected to the opposite ends thereof with conductive silver paste by an ordinary method and then the samples are immersed in liquidized hydrogen in a cryostat. After phenomenon of superconductivity is observed at 25K, the temperature dependence of resistance of the test samples are determined with rising the temperature gradually. Electrical resistance is determined by the common four probe method in a cryostat and the temperature is measured by a calibrated Au(Fe)-Ag thermocouple. Table 1 shows the results of "Tcf" which is the critical temperature and "Tc" which is the onset temperature where phenomenon of superconductivity is started to be observed.

TABLE 1

| Sample No. | Element and atomic ratio | | | | | Tc (K) | Tcf (K) |
|---|---|---|---|---|---|---|---|
| | Ba (1−x) | Y (1−w)x | γ | wx | Cu y | | |
| 2  | 0.6 | 0.36 | Zr | 0.04 | 1 | 99 | 91 |
| 3  | 0.6 | 0.32 | Zr | 0.08 | 1 | 96 | 86 |
| 9  | 0.6 | 0.36 | Ti | 0.04 | 1 | 88 | 77 |
| 11 | 0.4 | 0.54 | Ti | 0.06 | 1 | 86 | 74 |
| 13 | 0.6 | 0.36 | Hf | 0.04 | 1 | 87 | 75 |
| 14 | 0.6 | 0.36 | Si | 0.04 | 1 | 84 | 73 |
| 15 | 0.6 | 0.36 | Ge | 0.04 | 1 | 86 | 75 |
| 16 | 0.6 | 0.36 | Sn | 0.04 | 1 | 85 | 72 |
| 17 | 0.6 | 0.36 | Pb | 0.04 | 1 | 90 | 80 |
| 18 | 0.6 | 0.36 | Mn | 0.04 | 1 | 91 | 82 |

What we claim are:

1. Superconducting material of oxide which have a composition represented by the general formula:

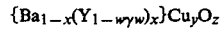

in which,

"$\gamma$" represents at least one element selected from a group consisting of titanium (Ti), zirconium (Zr), hafnium (Hf), silicon (Si), germanium (Ge), tin (Sn), lead (Pb) and manganese (Mn), and x, w and z represent numbers which are selected in the following ranges:
$0.4 \leq x \leq 0.6$
$1 \leq z \leq 5$; $0.1 \leq w \leq 0.2$ and which have crystal structures of perovskite type or quasi-perovskite type.

2. A process for producing a superconducting material of oxide which have a composition represented by the general formula:

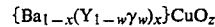

in which,

"$\gamma$" represents at least one element selected from a group consisting of titanium (Ti), zirconium (Zr), hafnium (Hf), silicon (Si), germanium (Ge), tin (Sn), lead (Pb) and manganese (Mn), and x, w and z represent numbers which are selected in the following ranges:
$0.4 \leq x \leq 0.6$
$1 \leq z \leq 5$; $0.1 \leq w \leq 0.2$ and which have crystal structures of perovskite type or quasi-perovskite type.

3. A process claimed in claim 2, characterized in that each of said powders of oxides or carbonates of said element "α", "β", "γ" and "δ" have an average particle size of less than 20 μm.

4. A process in claim 2, characterized in that said preliminary sintering is carried out at a temperature ranging from 700° C. to 1,000° C.

5. A process claimed in claim 2, characterized in that a sequence of steps including preliminary sintering, pulverization and compacting of the pulverized powder is repeated for at least two times.

6. A process claimed in claim 2, characterized in that sintered mass obtained by the last preliminary sintering operation is pulverized into a powder having an average particle size of less than 10 μm.

7. A process claimed in claim 2, characterized in that said shaped body possesses a relative density of from 60 to 80%.

8. A process claimed in claim 2, characterized in that said shape body to be sintered has a thickness measured from a surface to its center of less than 1 mm.

9. A process claimed in claim 2, characterized in that said preliminary sintering and/or said final sintering are carried out at a partial pressure of oxygen between 0.2 and 10 atm.

10. A process claimed in claim 2, characterized in that said shaped body which is subjected to the final sintering is further heat-treated at a temperature ranging from 500° to 800° C.

11. A process claimed in claim 2, characterized in that said sintered shaped body obtained after the final sintering is quenched rapidly, directly after the final sintering or after the sintered shaped body is re-heated at a temperature ranging from 500° to 800° C.

12. A process for producing a superconducting material of oxide which have a composition represented by the general formula:

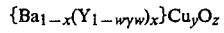
$\{Ba_{1-x}(Y_{1-w}y_w)_x\}Cu_yO_z$ in which,

"γ" represents at least one element selected from a group consisting of titanium (Ti), hafnium (Hf), silicon (Si), germanium (Ge), tin (Sn), lead (Pb) and manganese (Mn), and "x", "w", "y" and "z" represent numbers which are selected in the following ranges:
$0.4 \leq x \leq 0.6$; $0.4 \leq y \leq 1.0$; $1 \leq z \leq 5$; $0.1 \leq w \leq 0.2$ and which have crystal structures of perovskite type or quasi-perovskite type oxide having an average crystal grain of less than 30 μm, characterized by steps comprising mixing a powder of oxide or carbonate of Ba, a powder of oxide or carbonate of Y, a powder of oxide or carbonate of said element "γ" and a powder of oxide or carbonate of Cu in such proportions that the atom ratio of said elements "Ba":"Y":"γ":"Cu" is adjusted to $(1-x):(1-w)x:wx:y$, wherein, "x", "w" and "y" represent numbers which are selected in the following ranges:
$0.4 \leq x \leq 0.6$; $0.4 \leq y \leq 1.0$; $0.1 \leq w \leq 0.2$ subjecting the mixture obtained to preliminary sintering at a temperature ranging from 700° C. to 1,000° C., pulverizing a preliminary sintered mass, compacting the resulting pulverized powder into a shaped body, and subjecting the shaped body to the final sintering at a temperature which is not higher than a melting point of said pulverized powder but is not lower more than 100° C. from the melting point.

13. A superconducting material according to claim 1, wherein the amount of oxygen is that which produces a perovskite or quasi-perovskite crystal structure.

14. A superconducting material according to claim 1, wherein the amount of oxygen is that which produces a perovskite or quasi-pervoskite crystal structure.

15. A process according to claim 2, wherein the amount of oxygen in the superconducting material is that which produces a perovskite or quasi-perovskite crystal structure.

* * * * *